United States Patent [19]
Woodruff

[11] Patent Number: 5,298,773
[45] Date of Patent: Mar. 29, 1994

[54] SILICON-ON-INSULATOR H-TRANSISTOR LAYOUT FOR GATE ARRAYS

[75] Inventor: Richard L. Woodruff, Colorado Springs, Colo.

[73] Assignee: United Technologies Corporation, Hartford, Conn.

[21] Appl. No.: 929,600

[22] Filed: Aug. 17, 1992

[51] Int. Cl.⁵ .................. H01L 27/12; H01L 27/10; H01L 29/78
[52] U.S. Cl. ........................... 257/204; 257/202; 257/347; 257/401
[58] Field of Search ............... 257/202, 204, 347, 401

[56] References Cited
U.S. PATENT DOCUMENTS

| 4,513,307 | 4/1985 | Brown | 257/369 |
| 4,602,270 | 7/1986 | Finegold et al. | 257/369 |
| 4,791,474 | 12/1988 | Sugiura | 257/204 |
| 4,899,202 | 2/1990 | Blake et al. | 257/336 |
| 4,914,491 | 4/1990 | Vu | 257/260 |
| 5,187,113 | 2/1993 | Tyson et al. | 257/347 |

Primary Examiner—Rolf Hille
Assistant Examiner—Robert Limanek
Attorney, Agent, or Firm—Richard H. Kosakowski

[57] ABSTRACT

A digital silicon-on-insulator (SOI) H-transistor layout is disclosed for gate arrays. In the preferred embodiment, the invention basically comprises at least two H-transistors; the ends of each H-transistor terminate in two distinct regions of field oxide; the two sides of the H-transistor abut a body contact region; and each body contact region abuts a strip of field oxide, which has an underlying trench. This pattern is repeated vertically and horizontally, generating a structure compatible for gate array architecture. In a gate array, all transistors in a column are of the same type, such as N type or P type. Within a row, however, the transistors types could alternate.

41 Claims, 2 Drawing Sheets

SILICON-ON-INSULATOR H-TRANSISTOR LAYOUT FOR GATE ARRAYS

BACKGROUND OF THE INVENTION

This invention relates to silicon-on-insulator (SOI) H-transistors for digital technology. More particularly, it relates to a silicon-on-insulator H-transistor layout for gate arrays.

When scaling transistors to smaller geometries, the hot carrier effect becomes a problem. As a result of the electron/hole generation at the drain of an N channel transistor, hole current flows to the substrate contact of the P well. For bulk devices, which do not have a buried oxide layer, the cross-sectional area to the P well contact is large and the resistance is small. On the other hand, thin film SOI devices have a minimal cross-sectional area and a corresponding increase in resistance to the well contact. Further, thin film SOI devices, in which the source and drain junctions terminate on the buried oxide, are such that the only conduction path to the well contact is along the channel, which further reduces the cross-sectional area. Consequently, the same amount of hole current generated in a SOI or silicon on sapphire (SOS) device passes through a much smaller cross-sectional area (when contrasted with a bulk device), which causes a much larger voltage drop in the channel region. This voltage drop lowers the barrier at the source and injects more electrons into the channel region. This increase in current causes a larger amount of hole current to be generated, which results in additional barrier lowering. The cycle continues. The barrier is lowered even more; more electrons are injected into the channel region; more hole current is generated; and the barrier lowers still more. This uncontrolled state, caused by the hot carrier effect, is commonly known as snapback.

When scaling transistors to smaller geometries for mass production, it is also desirable to delay the routing of transistor elements as much as possible, providing maximum flexibility in the assignment of transistors to specific gates. For custom-made orders, it is desirable to produce as much of the order as possible before an order is received, waiting to personalize the transistors until after the request is received. Once the order is received, the specification as to which node of a transistor is to be the drain and which is to be the source can then be made. It is known in the art that gate array architecture provides this flexibility.

One patent which discloses the use of gate arrays is U.S. Pat. No. 4,602,270 to Finegold. Finegold discloses an improved gate array employing long strips of gates instead of current blocks. Isolation of selected adjacent circuits is provided by connecting adjacent transistor gates to opposite power supplies and permanently turning them off.

While Finegold does reveal an improved gate array, this invention also has several drawbacks. One drawback is that the Finegold invention is only useful on bulk devices. It is not compatible, however, with silicon-on-insulator devices which are favored among many persons over bulk devices.

Another drawback of the Finegold invention has been raised by persons in the space community. As previously mentioned, Finegold isolates selected adjacent circuits by connecting adjacent gates to opposite power supplies. The space community has noted that, if a necessary contact is missing, this mistake may not be detectable in the laboratory during routine checking. Unfortunately, it can only be detected after the satellite, or other device, has been launched into space. When orbiting, the satellite is irradiated with cosmic rays and this alters the transistors, causing them to fail. Consequently, because the failed devices are in orbit, they are inaccessible and cannot be repaired.

Accordingly, it is the primary object of the present invention to provide an improved gate array architecture.

It is another object to provide a gate array which can be used with silicon-on-insulator transistors.

It is yet another object to provide a gate array with a plurality of transistors which minimizes the resistive path to substrate node, thus reducing a transistor's tendency to go into an uncontrolled state; therefore, five-volt operation can be more easily obtained.

It is still another object to provide a gate array wherein the personalization of the transistors can be delayed until late in the fabrication process.

It is still a further object to provide a gate array wherein the accuracy of the contacts can be tested in the laboratory.

The above and other objects and advantages of this invention will become more readily apparent when the following description is read in conjunction with the accompanying drawings.

SUMMARY OF THE INVENTION

In the preferred embodiment, the invention basically comprises at least two H-transistors, each transistor comprising a polysilicon gate with an underlying channel region, a drain, a source, and a body contact region; each of the H-transistors terminates in two distinct regions of insulator, such as field oxide; and, each P+ body contact region abuts another strip of insulator, such as field oxide, which has an underlying trench. This pattern is repeated vertically and horizontally, generating a structure compatible for gate array architecture.

Within a vertical column, the transistors are always of the same type, such as always P type or always N type. Within a horizontal row, however, the transistors may alternate types. For example, one transistor may be N type, while the next transistor in the same row may be P type; the next transistor in the same row may be N type, and so on. One could, however, have several columns of N type transistors, then a single column of P type transistors, and so on.

DETAILED DESCRIPTION OF THE PREFERRED EMBODIMENT

Figure 1:
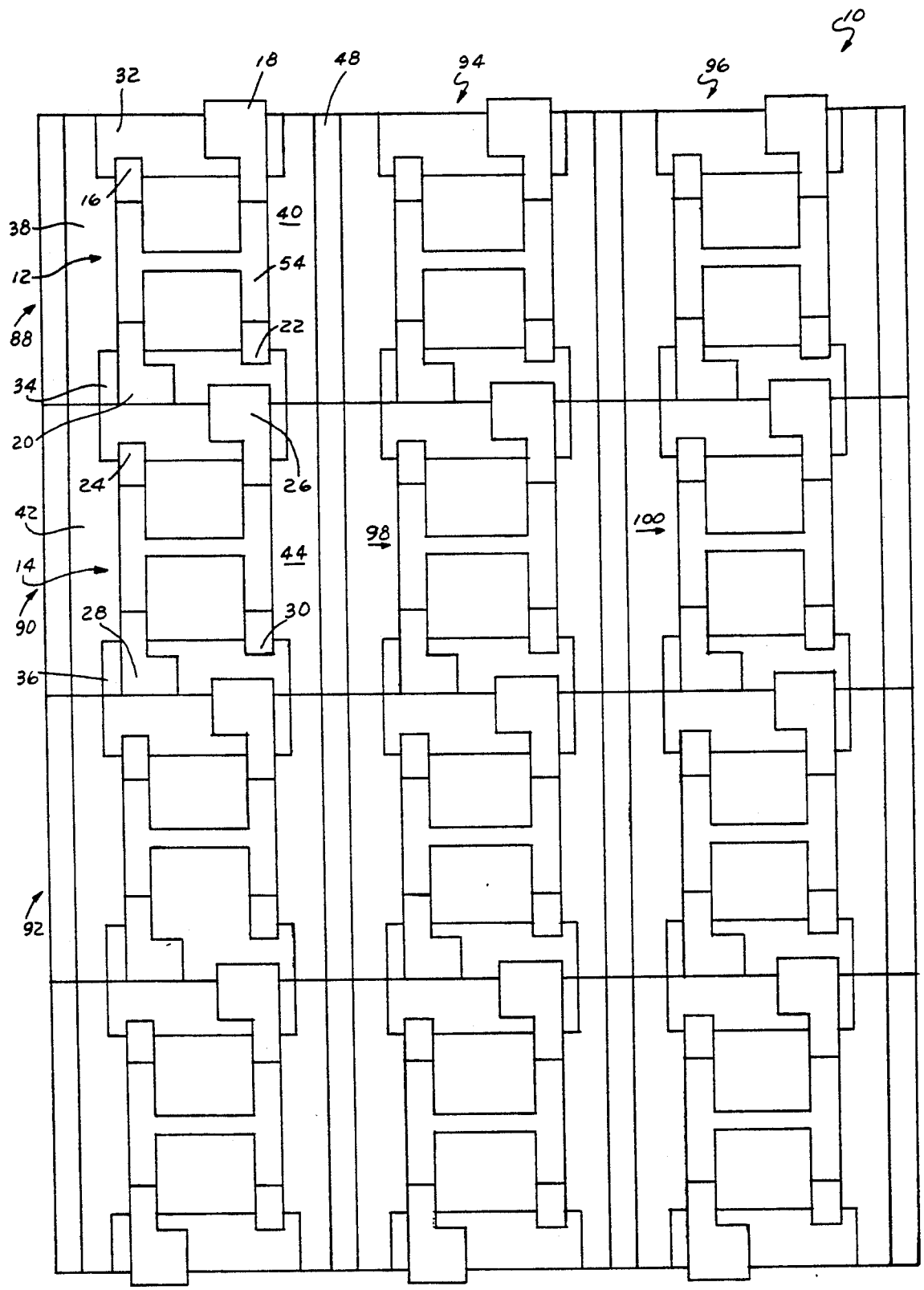
FIG. 1 is a plan view of multiple silicon-on-insulator H-transistors in a gate array layout, constructed in accordance with the present invention.

Referring to the drawings in detail, the preferred embodiment of an H-transistor gate array layout, in accordance with the present invention, is shown and generally designated by the reference numeral 10. See FIG. 1. The layout for each transistor is identical; therefore, only one transistor and its layout will be described on some occasions. As shown in greater detail in FIGS. 1, 2, the invention basically comprises two H-transistors such as 12, 14; each transistor 12, 14 has four end portions 16, 18, 20, 22, 24, 26, 28, 30 which overlie three separate fields of insulator 32, 34, 36; each H-transistor such as 12, 14 has two abutting body contact regions 38, 40, 42, 44; and these body contact regions 38, 40, 42, 44 abut an elongated strip of insulator 46, 48, each of which has an underlying elongated trench 50, 52. These two trenches 50, 52 are shown in cross-sectional view in FIG. 3. As shown in FIG. 1, this pattern is repeated vertically and horizontally, generating a structure compatible for gate array architecture.

Figure 2:
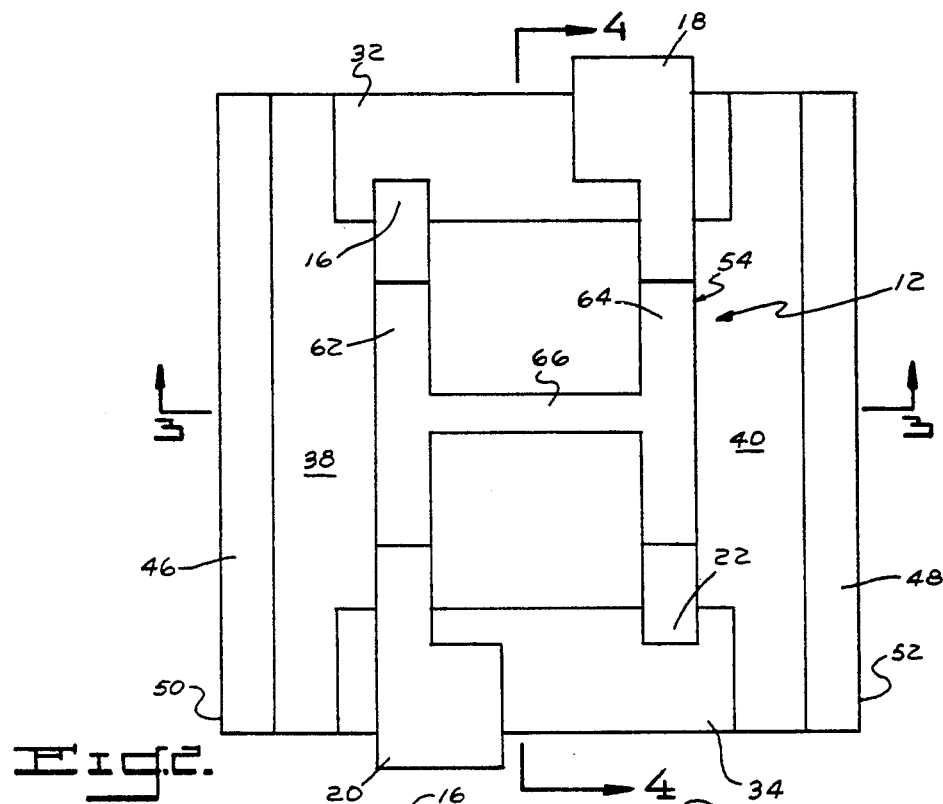
FIG. 2 is a plan view of one H-transistor in a gate array layout.
Figure 4:
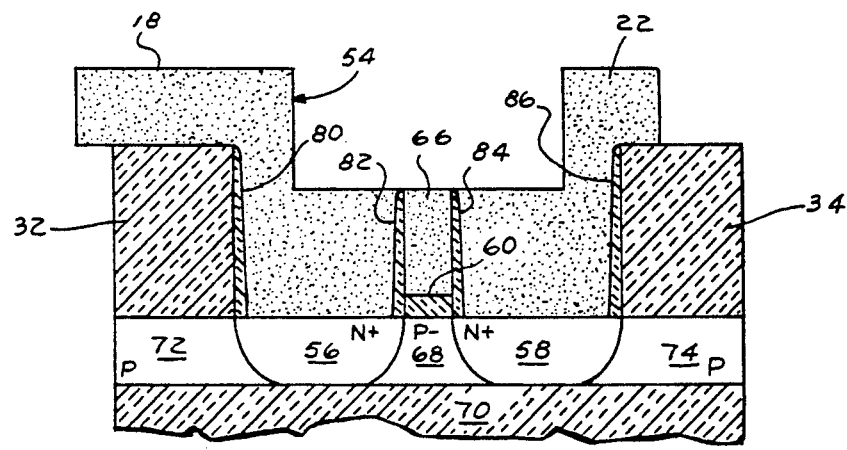
FIG. 4 is another cross-sectional view of the single H-transistor shown in FIG. 2, taken along line 4—4.

As shown in FIG. 4, each transistor, such as 12, is comprised of a polysilicon gate 54, a source 56, and a drain 58. The polysilicon gate 54 is approximately 4500 Å in height and overlies a layer of gate oxide 60. As shown in FIG. 2, the polysilicon gate 54 comprises two substantially parallel members 62, 64 and an integrally attached cross member 66, said cross member 66 integrally attached to the parallel members 62, 64 at substantially their midpoint. Referring again to FIG. 4, this layer of gate oxide 60 overlies a P− channel region 68. The doping of the P− channel region 68 is approximately $1 \times 10^{17} - 5 \times 10^{17}$ atoms per cubic centimeter. The source 56 and the drain 58 are each doped N+ regions. In this embodiment, the heavily doped source 56 and drain 58 regions contain approximately $5 \times 10^{19} - 5 \times 10^{20}$ atoms per cubic centimeter.

The P− channel region 68, the N+ source 56, and the N+ drain 58 each overlie a region of dielectric 70, which overlies a layer of silicon substrate (not shown). The layer of silicon is approximately 2000-4000 Å in depth; the insulator film is approximately 3500-4000 Å in depth; and the silicon substrate is approximately 400-600 microns in depth. Different insulator films, or dielectrics, could be used. For example, one could use silicon dioxide ($SiO_2$), sapphire ($Al_2O_3$), or spinel ($MgAl_2O_4$). If silicon dioxide is used as the insulator film, it can be formed by any suitable method, such as an implanted oxygen method. This implanted oxygen method (SIMOX) is discussed in U.S. Pat. Nos. 3,855,009 and 4,241,359; these patents are hereby incorporated by reference.

Because the N+ source 56 and the N+ drain 58 terminate on insulator 70, the channel 68 is electronically connected to the P well 38, 40 via a path (not shown) along the channel 68. As a result of the small cross-sectional area of this path, the series resistance to the P well contact 76, 78 is very dependent upon the distance.

Further, as shown in FIG. 4, the N+ source 56 and the N+ drain 58 each abut P well regions 72, 74. These P well regions 72, 74 are doped along the order of $1 \times 10^{17} - 5 \times 10^{17}$ atoms per cubic centimeter.

Distinct regions of insulator, such as 32, 34, separate each transistor, such as 12, within a column and substantially overlie the P well regions 72, 74. See FIG. 4. In this embodiment, field oxide has been used as the insulator. These walls of field oxide 32, 34 are approximately 6000 Å in height. Any suitable insulator can be used in lieu of field oxide, such as sapphire or spinel.

Figure 3:
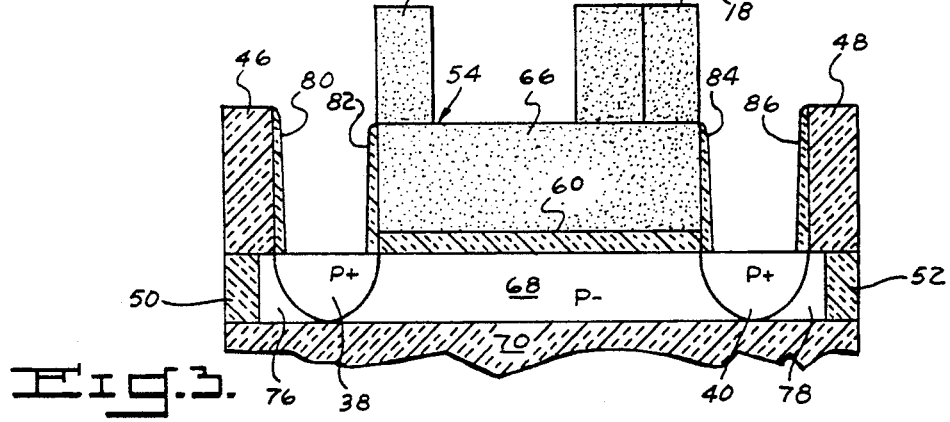
FIG. 3 is a cross-sectional view of the single H-transistor shown in FIG. 2, taken along line 3—3.

One transistor, such as 12, is shown in another cross-sectional view in FIG. 3. As shown, the polysilicon gate 54 is bounded on both sides by P+ well contact regions 38, 40. Between the two P+ well contact regions 38, 40 and the two trenches 50, 52 are two P wells 76, 78. Field oxide regions 46, 48 partially overlie both these P wells 76, 78 and trench refills 50, 52. All of these components are overlying a region of dielectric 70.

Also shown in FIG. 3 are spacers 80, 82, 84, 86. These spacers 80, 82, 84, 86, which are commonly known in the art, are necessary only with transistors that are smaller than two microns. With transistors this small, the hot carrier effect is a large problem. Spacers, such as 80, 82, 84, 86, allow one to create a modified transistor design to accommodate a lightly-doped drain (L.D.D.). Spacers 80, 82, 84, 86 are made by cutting an active region (not shown), depositing polysilicon, and patterning polysilicon such that there is a piece of polysilicon going through an active region which is going to be the transistor gate, such as 54. Afterwards, phosphorous is lightly implanted such that there is an N− region everywhere that is active and not polysilicon. Oxide is then deposited and a vertical etch is done. This leaves oxide on the side of poly, which is what a spacer 80, 82, 84, 86 is. Afterwards, N+ is implanted in the source such as 56 and drain such as 58. The spacers 80, 82, 84, 86 block this N+ implant from going into the adjacent poly region.

When two transistors, such as 12, 14, are arranged in a column, the column can be defined as having a top portion 88, a mid portion 90, and a bottom portion 92. Each of these three portions 88, 90, 92 has a corresponding region of insulator, such as 32, 34, 36. The region of insulator 34 in the mid portion 90 is common to two transistors, such as 12, 14.

When four transistors, such as 12, 14, are arranged in a gate array architecture, they could be arranged in a two-by-two matrix design (not shown). In this matrix design, there would be two transistors in each row and two transistors in each column.

As shown in FIG. 1, within a horizontal row, transistors, such as 12, 94, 96, could alternate types. For example, if transistor 12 were N type, transistor 94 could be P type, transistor 96 could be N type, and so on. Conversely, each transistor in a vertical column will be of the same type. For example, transistor 12 will be the same type as transistor 14, which could be N type. Transistor 94 and transistor 98 would both be P type. Finally, transistors 96 and 100 would both be N type. Further, there could be several columns of the same type adjacent to a single column of a different type, and so on.

When fabricating a gate array 10, one begins with a single silicon-on-insulator wafer (not shown). First, a trench mask (not shown) is patterned by photolithography. Afterwards, the region defined as the trench is etched, leaving behind mesas. These mesas are created simultaneously all over the wafer. Finally, a P well mask is used to implant P type doping in all P wells simultaneously. An N well mask (not shown) is used for similar formation of N wells for P channel devices.

The end portions, such as 18, 20, of each transistor, such as 12, are made larger than the other two end portions, such as 16, 22. See FIG. 2. These portions are made larger so that there can be some misalignment to the polysilicon gate 54, yet still make electrical connection.

The trenches 50, 52, shown in FIG. 3, can be processed by two different methods. Both methods, however, require etching out the silicon (not shown) all the way to the buried oxide. This process leaves behind islands (not shown), commonly known as mesas, of silicon on top of the insulator. After these holes are etched out, they are refilled with an oxide material; thus, the mesas are totally electronically isolated. In the first method, which is preferred, a thin layer of the sidewalls (not shown) is oxidized and then refilled with polysilicon (poly). The second method requires the holes to be totally refilled with oxide, without oxidizing the sidewalls.

The hot carrier effect discussed herein is primarily a problem with N channel devices. Consequently, the invention has been described with only N channel devices. It should be understood by those skilled in the art, however, that this same gate array architecture 10 could be used for P channel devices, simply by reversing the doping.

The combined use of field oxide regions, such as 32, 34, 36 and trenches, such as 50, 52, allows for adjacent placement of additional columns at the minimal design rule. This provides for tight column spacing and higher density.

Structuring the H-transistors, such as 12, into a gate array 10 allows for maximum flexibility during the fabrication process. Mass producers of H-transistors in gate array layouts can build up a large library of transistors that are built up to contact. At this point, all the transistors in all of the gate arrays are identical. After receiving an order from a customer, software customizes the gate arrays to the customer's design specification. In particular, until the time that a customer puts in an order, the source, such as 56, and drain, for example 58, of each H-transistor, such as 12, have not been determined. In H-transistors, for example 12, the source, which has been designed as 56, could actually operate as the drain 58, while the drain 58 could operate as the source 56, if the process designer so desired.

In thin-film silicon-on-insulator devices, which do not employ H-transistors, the same quantity of hole carriers are generated as in bulk devices; however, because these conventional thin-film silicon-on-insulator devices have a smaller cross-sectional area through which the holes can pass, the holes build-up. This build-up ultimately reduces the barrier at the source and injects more electrons into the channel. This increase in current creates more holes, which in turn further lower the barrier at the source. Implementing H-transistors, such as 12, into a gate architecture 10, substantially alleviates this hot carrier effect, which causes snapback. H-transistors, for example 12, allow the substrate of the well contacts 38, 40, for example, to be as close as possible to the channel, such as 68, where the carriers are being generated. H-transistors provide a more efficient collection of hole carriers and eliminate the changes in potential; thus, reducing the tendency of the transistor to go into an uncontrolled states.

This H-transistor layout 10 provides a five-volt operation for thin film SOI transistors. An H configuration of polysilicon gate, such as 54, provides a minimum distance from the P+ well tie, such as 38, 40, to the channel region, such as 68. Polysilicon as a spacing mechanism for N+ and P+ implants allows for smaller dimensions than would be allowed using field oxide. Salicide provides a low impedance path along the P+ region, and this, in turn, allows flexibility in contact placement.

In the present embodiment 10, isolation between each H-transistor, such as 12, is achieved through use of trenches, for example 50, 52. Because there is no special contact for each transistor (such as setting them to $V_{cc}$ or to ground), the accuracy of the design can be tested in the laboratory. There is less of a fear of missing a contact. In addition, because trenches, such as 50, 52, are used, any radiation received by them in space will not alter their operation. Consequently, this design 10 offers a potentially more robust and reliable operation in space than conventional gate array transistor design.

It should be understood by those skilled in the art that obvious structural modifications can be made without departing from the spirit of the invention. Accordingly, reference should be made to the accompanying claims, rather than the foregoing specification, to determine the scope of the invention.

Having thus described the invention, what is claimed is:

1. An integrated circuit gate array device formed within a layer of silicon disposed over an insulator film located on top of a silicon substrate comprising:
   a. at least two H-transistors arranged in a column-like design, wherein the column-like design has a top portion, a mid portion, and a bottom portion, wherein each H-transistor comprises:
      i. a gate comprised of two substantially parallel, elongated members and an integrally attached cross member;
      ii. a channel region, the cross member disposed over the channel region;
      iii. a gate insulator region disposed between the cross member and the channel region;
      iv. a source region located to one side of the cross member and between the parallel members;
      v. a drain region located to the other side of the cross member and between the parallel members; and
      vi. two well regions having a predetermined doping concentration, each well region abutting a parallel, elongated member of the gate;
   b. a first region of insulator at substantially the top of the column-like design;
   c. a second region of insulator located between adjacent transistors in a column at substantially the midpoint of the column-like design; and
   d. a third region of insulator which terminates at substantially the bottom portion of the column-like design.

2. The gate array of claim 1, wherein at least one transistor is sufficiently doped to create an N channel device.

3. The gate array of claim 1, wherein at least one transistor is sufficiently doped to create a P channel device.

4. The gate array of claim 1, wherein each transistor is flanked on both sides by a corresponding elongated region of insulator.

5. The insulator of claim 4, wherein each elongated insulator region overlies an elongated trench.

6. The gate array of claim 1, wherein a plurality of transistors are arranged in a column.

7. The gate array of claim 5, wherein a plurality of transistors are arranged in at least two rows.

8. The gate array of claim 1, wherein the transistors within a column are all of the same type.

9. The gate array of claim 7, wherein the transistors within a row are of alternating types.

10. The gate array of claim 6, wherein all the transistors within a column are N type.

11. The gate array of claim 6, wherein all the transistors within a column are P type.

12. The gate array of claim 1, wherein the insulator regions located at substantially the column's top, mid, and bottom portions are comprised of field oxide.

13. The gate array of claim 1, wherein the insulator film is comprised of silicon dioxide.

14. The gate array of claim 1, wherein the insulator film is comprised of sapphire.

15. The gate array of claim 1, wherein the insulator film is comprised of spinel.

16. An integrated circuit gate array device formed within a layer of silicon disposed over an insulator film located on top of a silicon substrate comprising:
   a. a plurality of H-transistors arranged in a matrix-like design, wherein each matrix has at least two columns and at least two rows, wherein each column has a top portion, a mid portion, and a bottom portion, wherein each transistor comprises:
      i. a gate comprised of two substantially parallel, elongated members and an integrally attached cross member;
      ii. a channel region, the cross member disposed over the channel region;
      iii. a gate insulator region disposed between the cross member and the channel region;
      iv. a source region located to one side of the cross member and between the parallel members;
      v. a drain region located to the other side of the cross member and between the parallel members; and
      vi. two well regions having a predetermined doping concentration, each well region abutting a portion of a corresponding parallel, elongated member of the gate;
   b. a first region of insulator located at substantially the top of each column;
   c. a second region of insulator located between the adjacent transistors in a column at substantially the midpoint of each column;
   d. a third region of insulator located at substantially the bottom of each column; and
   e. wherein each transistor is flanked on both sides by a corresponding elongated insulator region oriented parallel to the associated well region.

17. The gate array of claim 16, wherein at least one transistor is sufficiently doped to create an N channel device.

18. The gate array of claim 16, wherein at least one transistor is sufficiently doped to create a P channel device.

19. The gate array of claim 16, wherein each of the elongated regions of insulator overlies a corresponding elongated trench.

20. The gate array of claim 16, wherein the transistors within a column are all of the same type.

21. The gate array of claim 16, wherein the transistors within a row of alternating types.

22. The gate array of claim 16, wherein all the transistors within a column are N type.

23. The gate array of claim 16, wherein all the transistors within a column are P type.

24. The gate array of claim 16, wherein the insulator regions located at the column's top, mid, and bottom portions are comprised of field oxide.

25. The gate array of claim 16, wherein the insulator film is comprised of silicon dioxide.

26. The gate array of claim 16, wherein the insulator film is comprised of sapphire.

27. The gate array of claim 15, wherein the insulator film is comprised of spinel.

28. An integrated circuit gate array device formed within a layer of silicon disposed over an insulator film located on top of a silicon substrate comprising:
   a. at least two H-transistors arranged in a column-like design, wherein the column has a top portion, a mid portion, and a bottom portion, wherein each transistor comprises:
      i. a gate comprised of two substantially parallel, elongated members and an integrally attached cross member;
      ii. a channel region, the cross member disposed over the channel region;
      iii. a gate insulator region disposed between the cross member and the channel region;
      iv. a source region located to one side of the intersection of the cross member and between the parallel members;
      v. a drain region located to the other side of the cross member and between the parallel members; and
      vi. two well regions having a predetermined doping concentration, each well region abutting a portion of a corresponding, parallel, elongated member of the gate;
   b. a first region of insulator located at substantially the top of the column-like design;
   c. a second region of insulator located between adjacent transistors in the column at substantially the midpoint of each column;
   d. a third region of insulator located at substantially the bottom of each column; and
   e. wherein each transistor is flanked on both sides by a corresponding elongated insulator region oriented parallel to the associated well region.

29. The gate array architecture of claim 28, wherein at least one transistor is sufficiently doped to create an N channel device.

30. The gate array architecture of claim 28, wherein at least one transistor is sufficiently doped to create an P channel device.

31. The gate array of claim 28, wherein each of the elongated regions of insulator overlies a corresponding elongated trench.

32. The gate array of claim 31, wherein a plurality of transistors are arranged in a column.

33. The gate array of claim 31, wherein a plurality of transistors are arranged in at least two rows.

34. The gate array of claim 32, wherein the transistors within a column are all of the same type.

35. The gate array of claim 31, wherein the transistors within a row are of alternating types.

36. The gate array of claim 32, wherein all the transistors within a column are N type.

37. The gate array of claim 32, wherein all the transistors within a column are P type.

38. The gate array of claim 28, wherein the insulator regions located at the column's top, mid, and bottom portions are comprised of field oxide.

39. The gate array of claim 28, wherein the insulator film is comprised of silicon dioxide.

40. The gate array of claim 28, wherein the insulator film is comprised of sapphire.

41. The gate array of claim 28, wherein the insulator film is comprised of spinel.

* * * * *

UNITED STATES PATENT AND TRADEMARK OFFICE
CERTIFICATE OF CORRECTION

PATENT NO. : 5,298,773

DATED : March 29, 1994

INVENTOR(S) : Richard L. Woodruff

It is certified that error appears in the above-identified patent and that said Letters Patent is hereby corrected as shown below:

Column 7, line 56, claim 21, After "row" insert --are--

Column 8, line 1, claim 27, Change "15" to --16--

Signed and Sealed this

Twenty-third Day of August, 1994

Attest:

BRUCE LEHMAN

Attesting Officer

Commissioner of Patents and Trademarks